United States Patent
Mueller

(10) Patent No.: US 6,185,106 B1
(45) Date of Patent: *Feb. 6, 2001

(54) PRINTED CIRCUIT BOARD EXTRACTOR TOOL OPERATED LATCH

(75) Inventor: Robert S. Mueller, Cupertino, CA (US)

(73) Assignee: Cisco Technology, Inc., San Jose, CA (US)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/576,316

(22) Filed: Dec. 21, 1995

(51) Int. Cl.[7] ....................................................... H05K 7/14
(52) U.S. Cl. ........................ 361/798; 361/754; 361/759; 361/801; 439/160
(58) Field of Search .................................... 361/683–686, 361/724–728, 732, 736, 740, 741, 747, 754, 756, 759, 801, 802, 798; 403/321, 19; 292/203, 207, 229; 70/465; 439/157, 160, 153

(56) References Cited

U.S. PATENT DOCUMENTS

| 4,547,835 | * | 10/1985 | Pansaerts et al. . |
| 5,321,962 | * | 6/1994 | Ferchau et al. ........................ 70/208 |

FOREIGN PATENT DOCUMENTS

| 406097681A | * | 4/1994 | (JP) ...................................... 361/754 |

\* cited by examiner

*Primary Examiner*—Jayprakash N. Gandhi
(74) *Attorney, Agent, or Firm*—Blakley, Sokoloff, Taylor & Zafman LLP

(57) ABSTRACT

An apparatus for locking a printed circuit board inside a card cage is disclosed. For one embodiment of the locking assembly, the locking assembly is mounted on a printed circuit board. The locking assembly is movable from a unlocked position to a locked position to lock the printed circuit board into the card cage. The locking assembly is unmovable to return to the unlocked position without the aid of a separate unlocking mechanism.

20 Claims, 10 Drawing Sheets

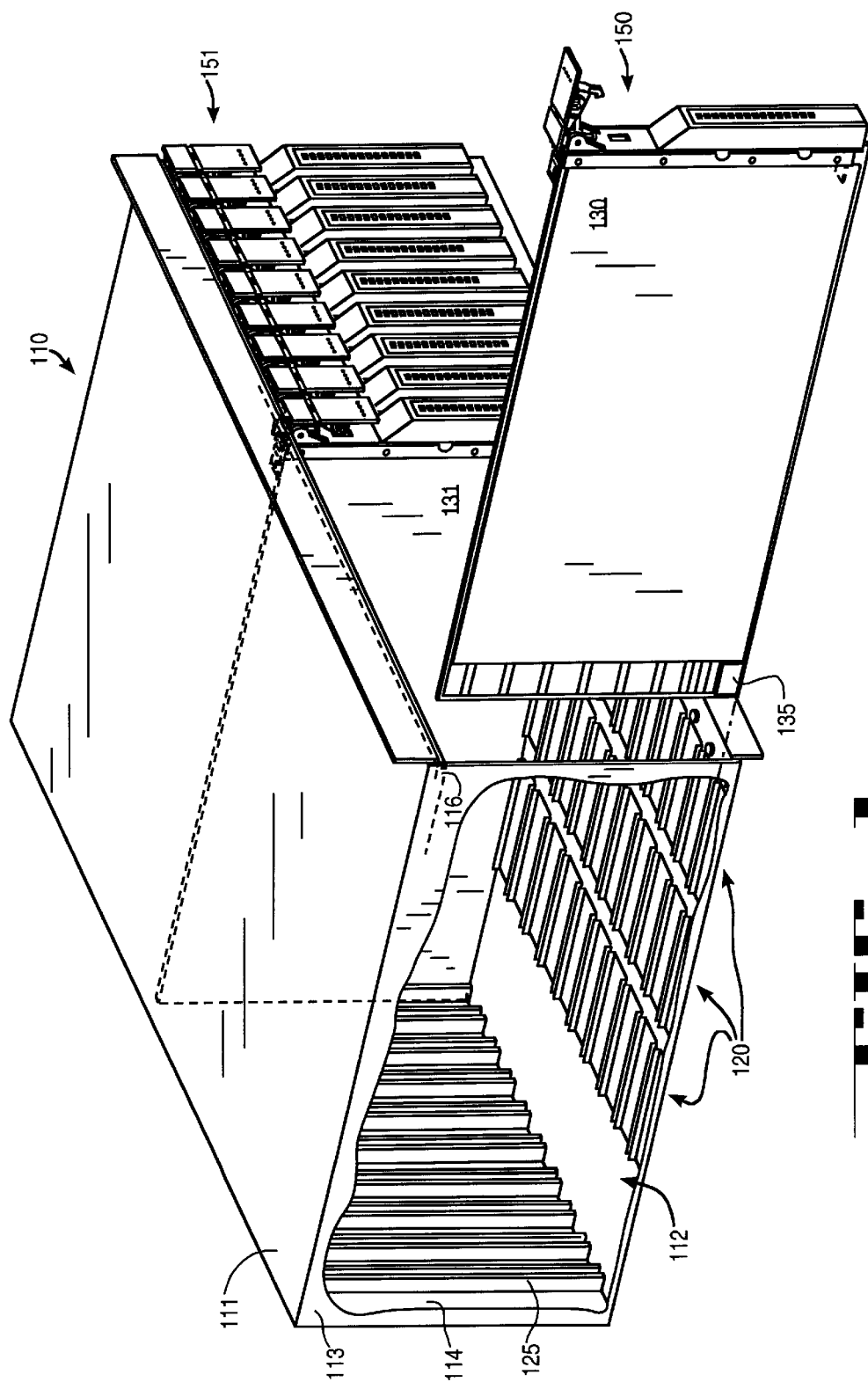
FIG_1

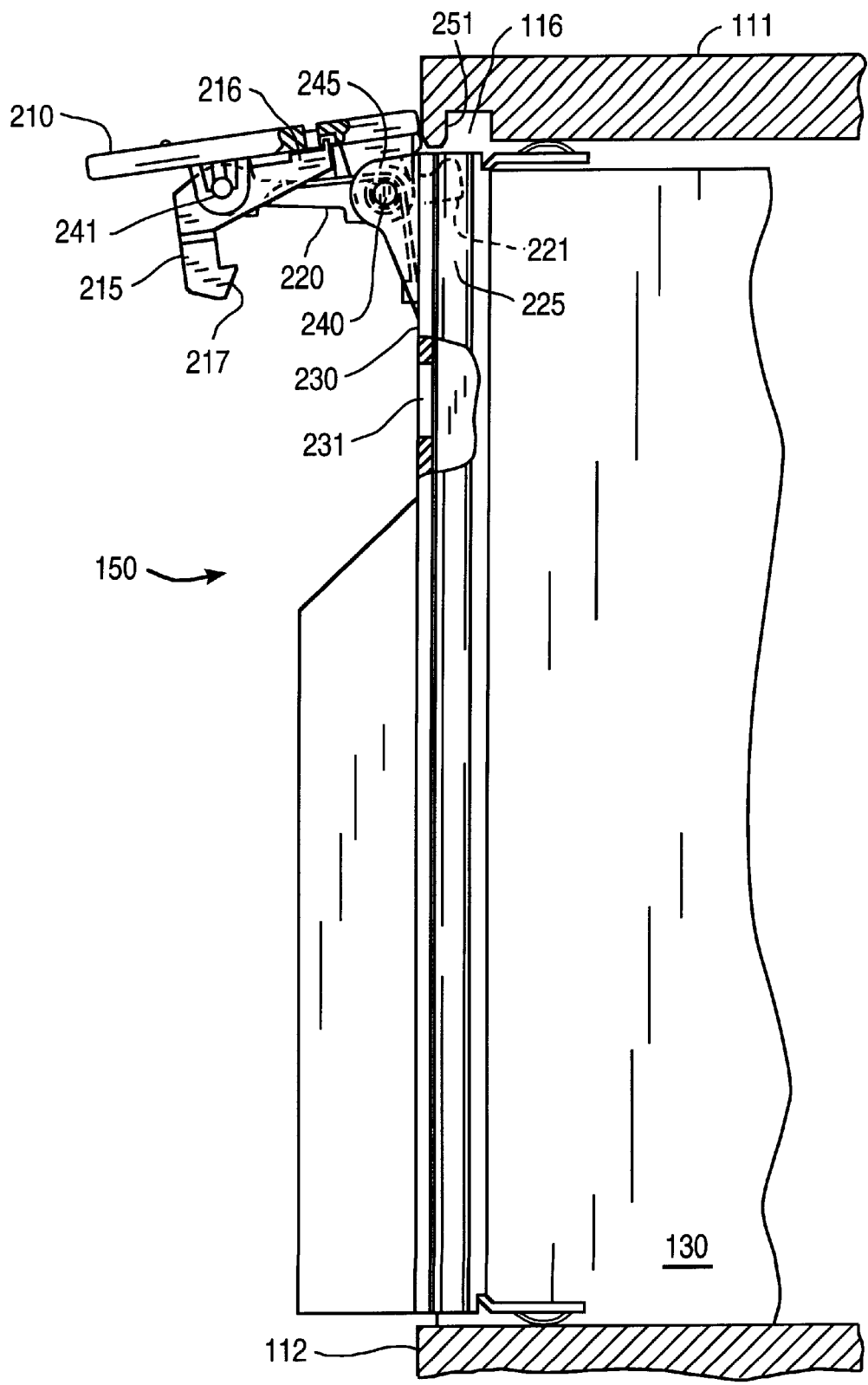
FIG_2A

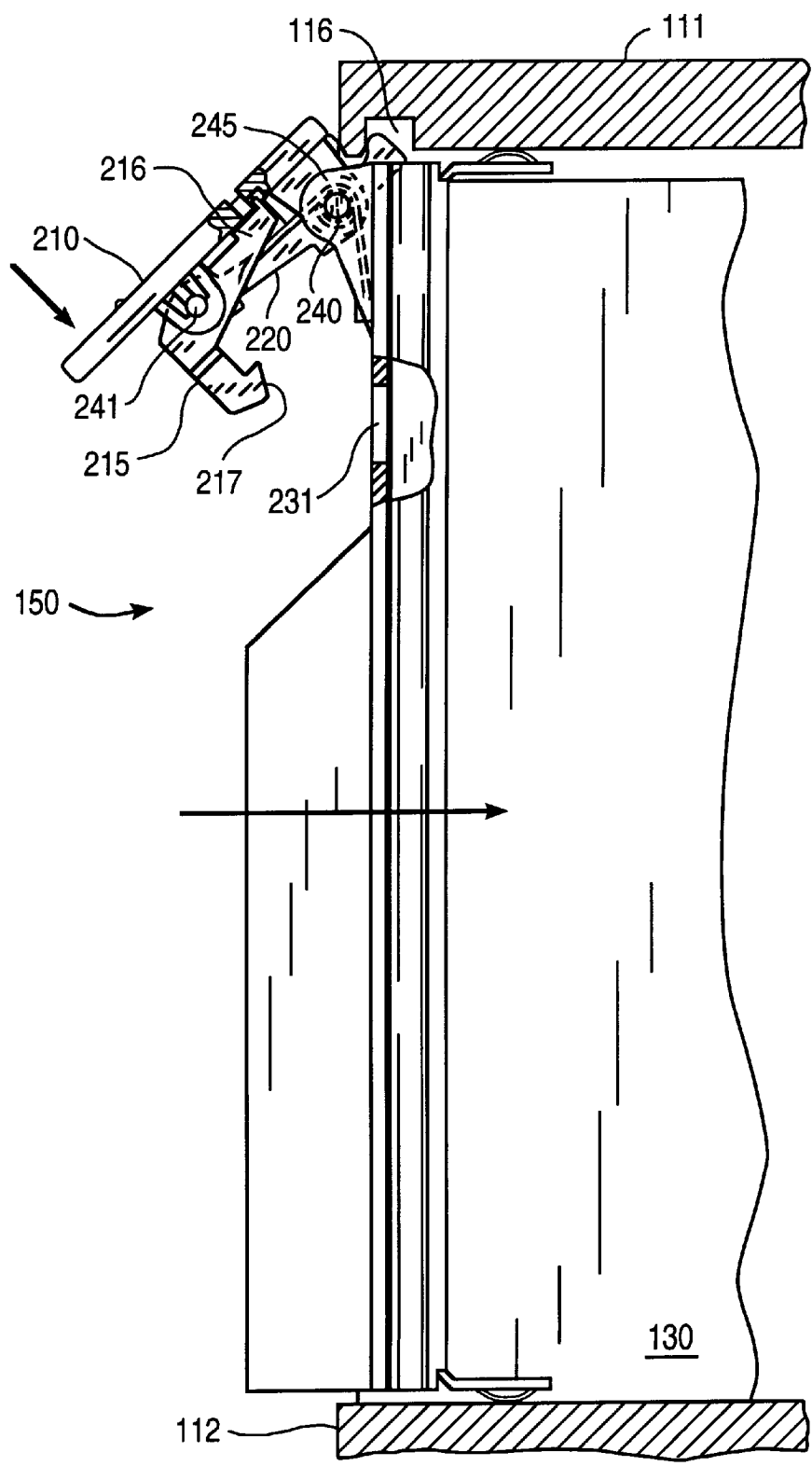
FIG_2B

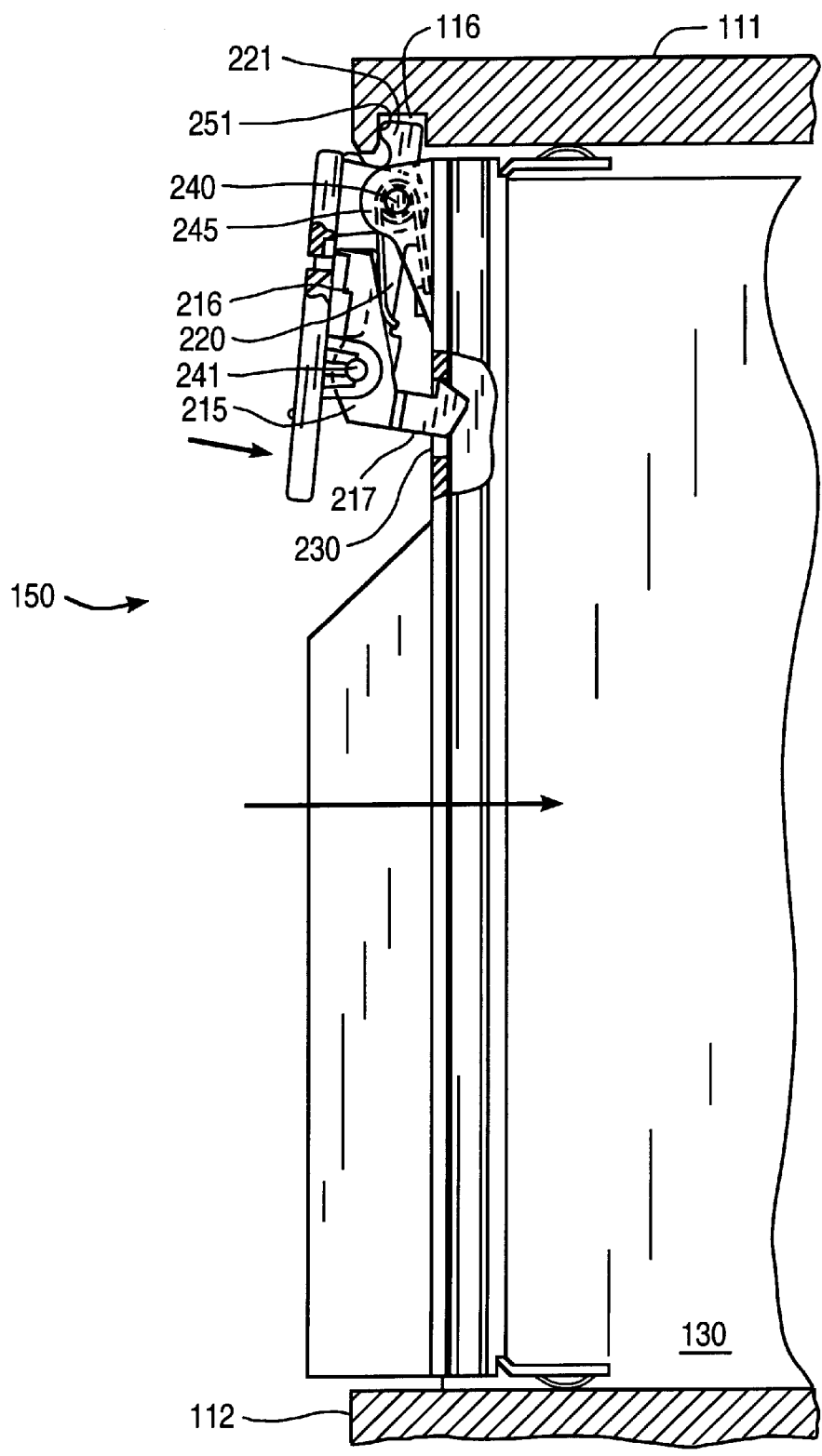
FIG_2C

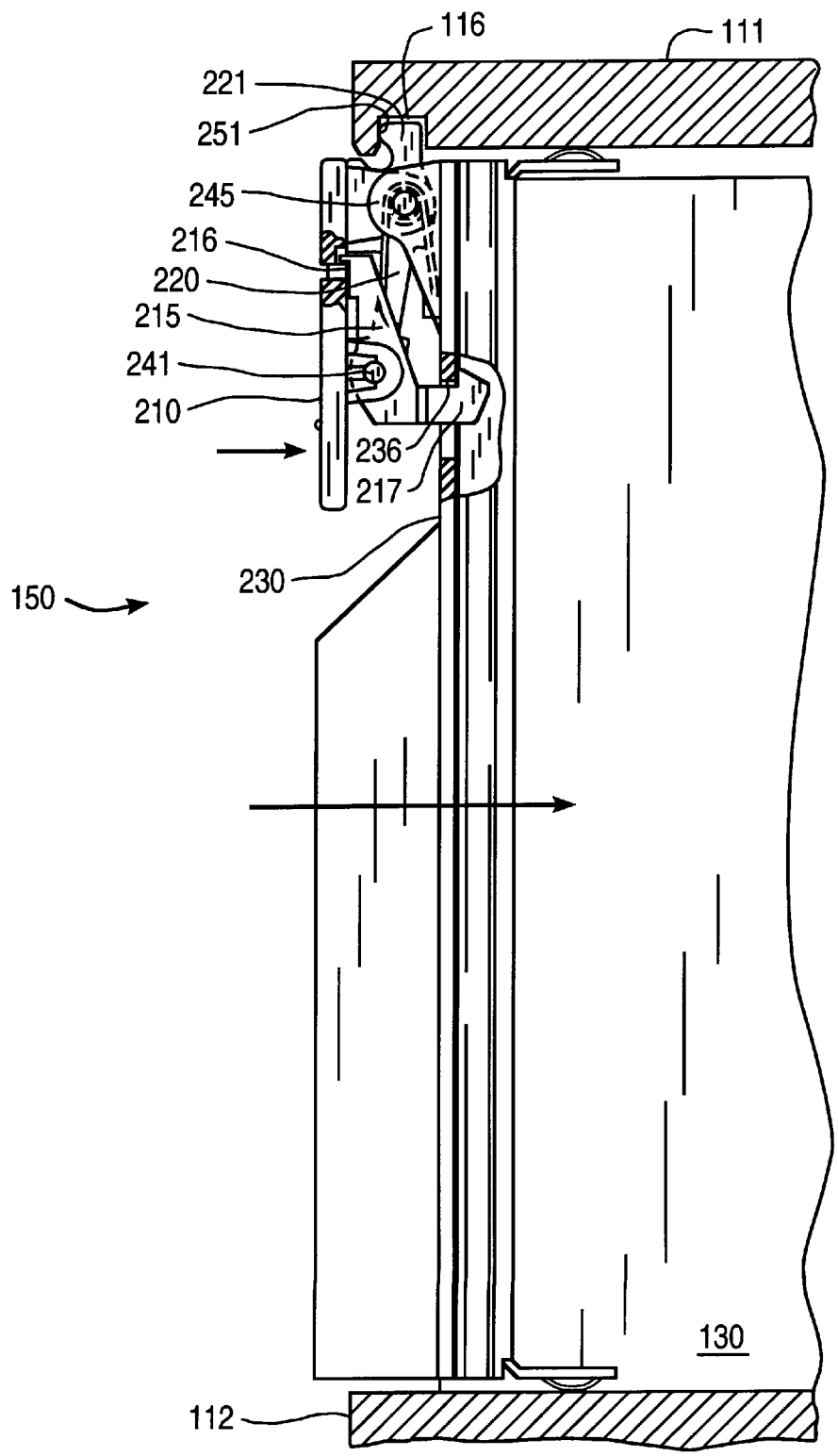
FIG_2D

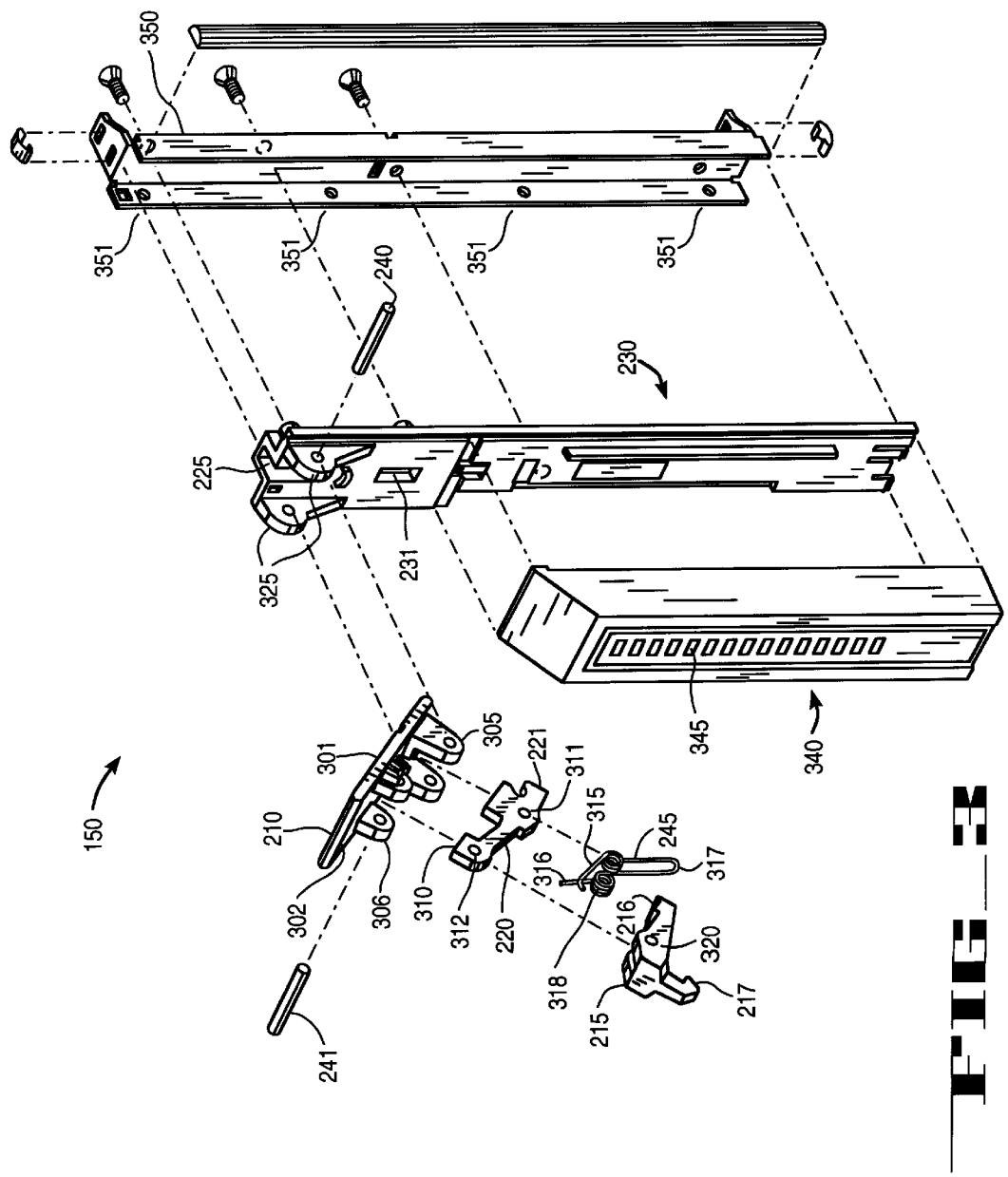
FIG_3

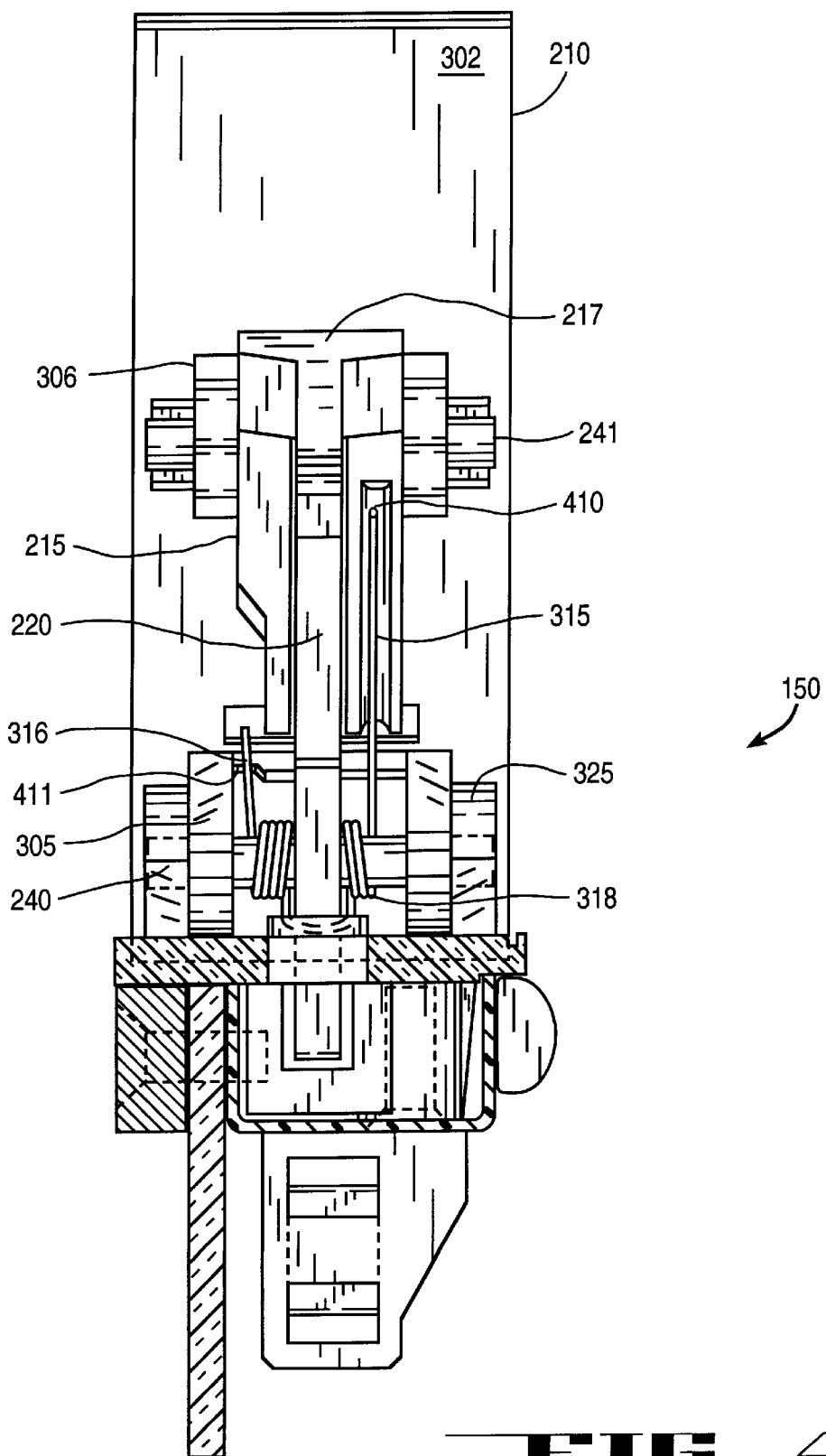
FIG_4

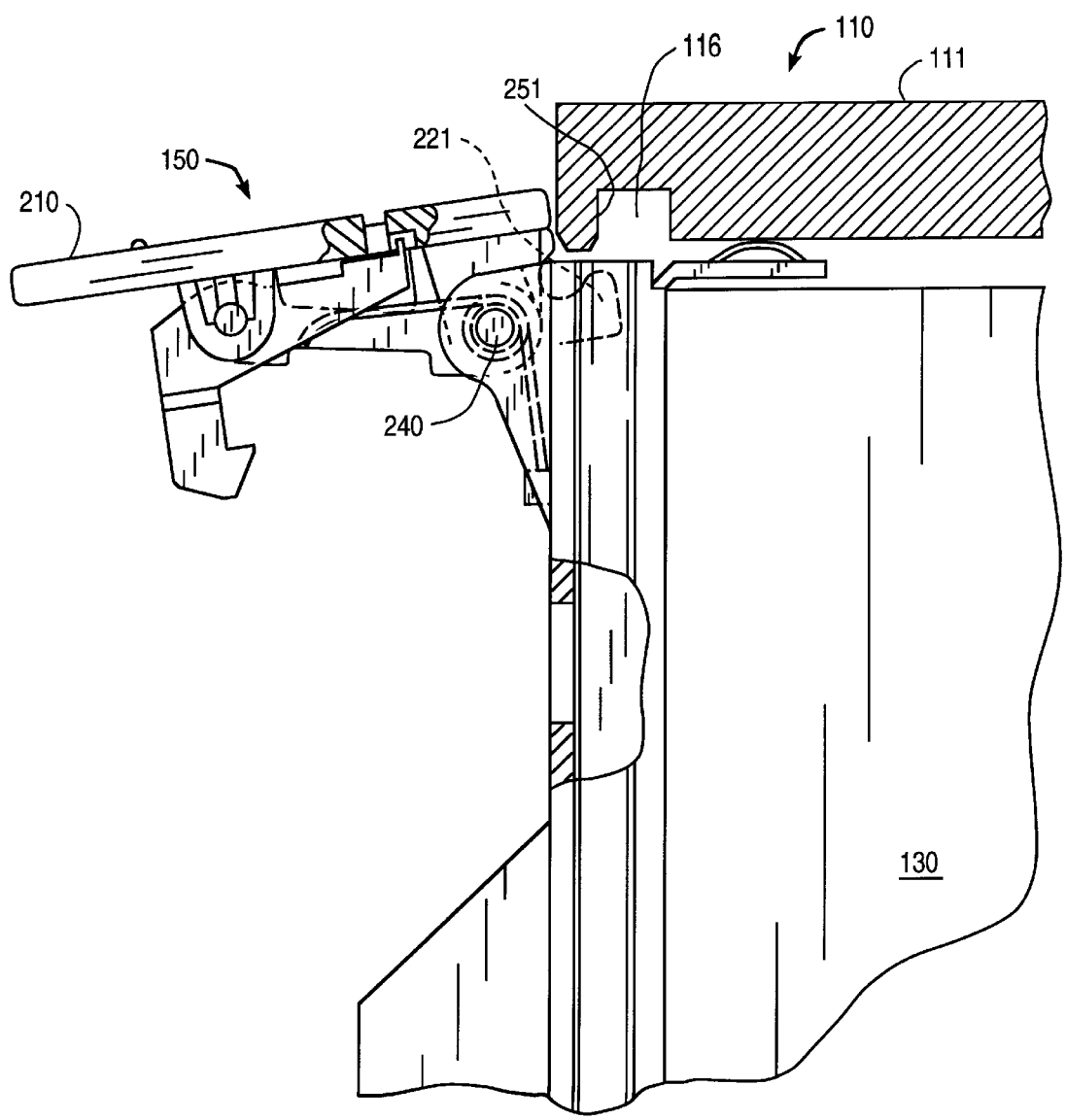
FIG_5A

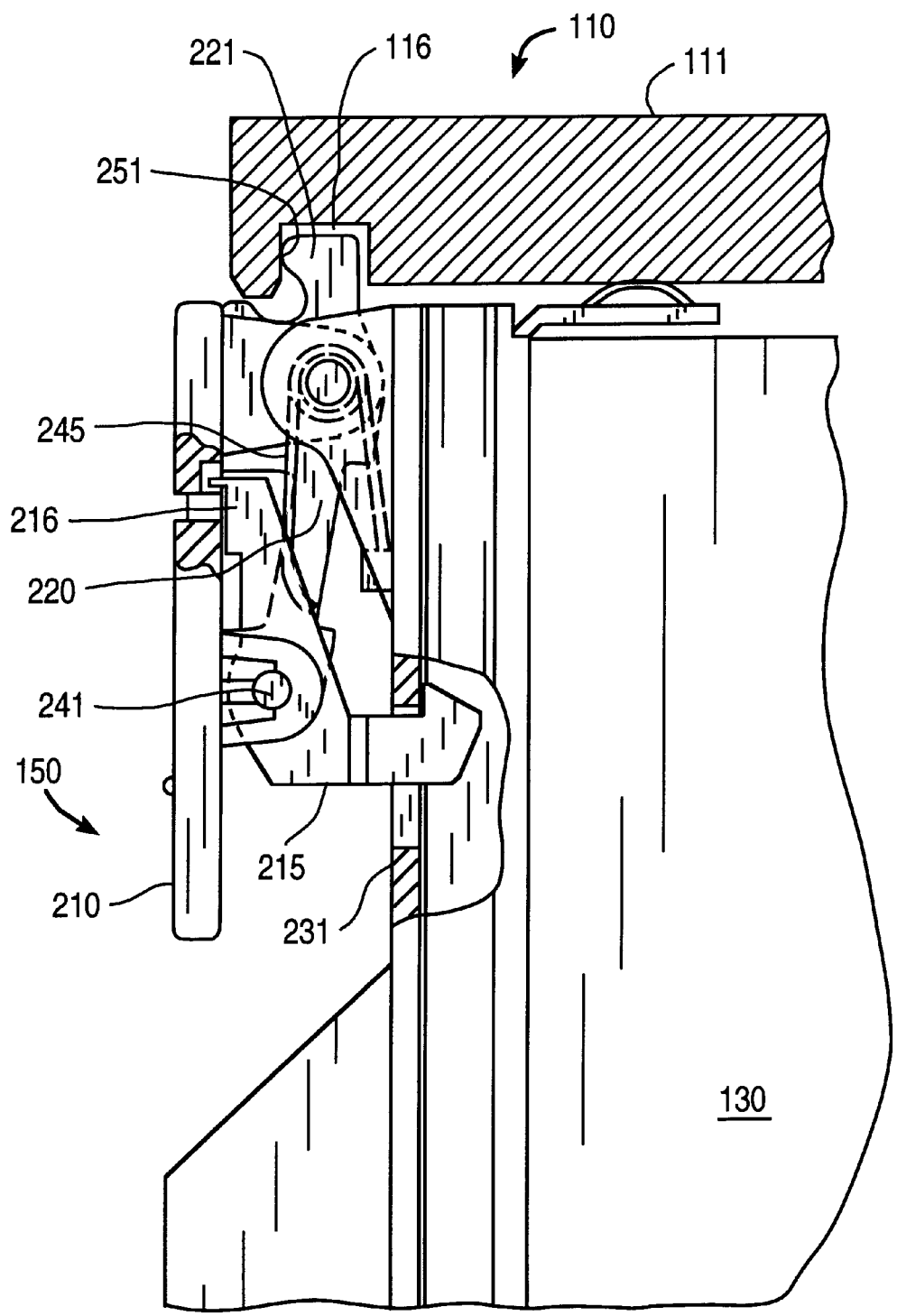
FIG_5B

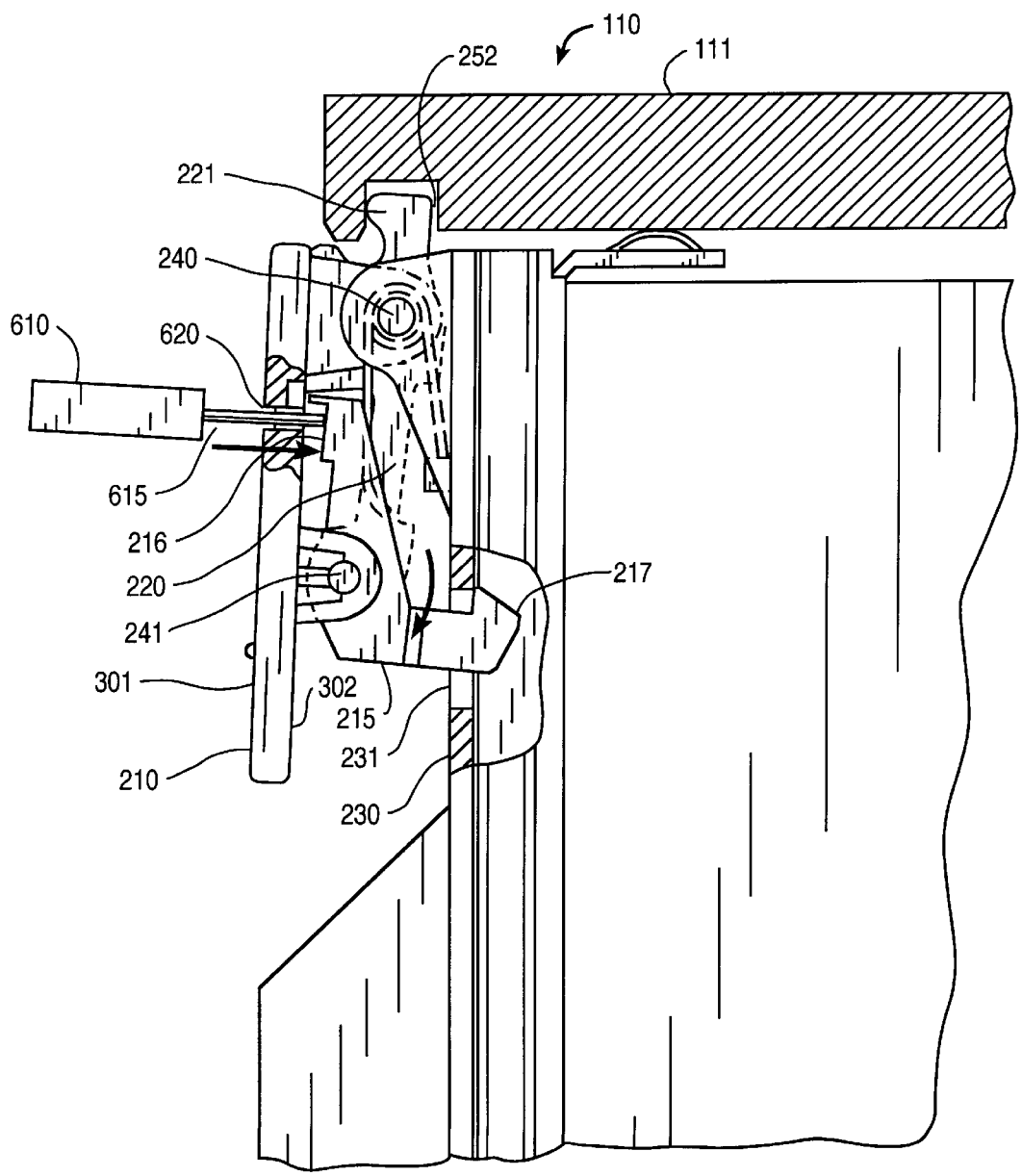
FIG_6

PRINTED CIRCUIT BOARD EXTRACTOR TOOL OPERATED LATCH

FIELD OF THE INVENTION

The present invention relates to a locking tool. More specifically, the present invention relates to an improved apparatus for locking a printed circuit board into a card cage.

BACKGROUND OF THE INVENTION

Modern computer systems often are assembled by interconnecting various electronic modules on printed circuit boards. The printed circuit boards are commonly loaded into racks or "card cages," which facilitate the mounting and connection of the electronic modules. Card cages are a form of housing for supporting printed circuit boards in compact or dense configurations. Card cages typically comprise an open framework with a top, bottom, back, and sides. Front support rails define an open front through which the printed circuit boards are inserted into the card cage. The back typically supports a backplane with backplane connectors for receiving mating connectors on a rear edge of each printed circuit board. Rails attached to the top and bottom or to the sides or intermediate locations engage parallel edges of the printed circuit board to guide the printed circuit board into the card cage in either a vertical or horizontal orientation, to align the printed board connector with a corresponding backplane connector, and to support the printed circuit board after it is seated in the card cage.

It is often desirable to lock the printed circuit board in place. For example, commercial underwriters impose requirements on manufacturers of systems that have printed circuit boards operating at voltages above a certain level. The manufactures must provide safety mechanisms that prevent individuals from accidentally accessing the printed circuit boards.

In the past, manufacturers used machine screws that lead through lead holes in the front panel. These screws thread into a front support rail to provide the locking function required by the commercial underwriters. This approach, however, required that an individual take additional time to thread and unthread the screws through the front support rail whenever a printed circuit board was put in or taken out of the card cage. It was also possible for individuals to bypass the locking function by simply not threading the screws at all.

SUMMARY AND OBJECTS OF THE INVENTION

One object of the present invention is to provide a locking mechanism that is easy to use.

Another object of the present invention is to provide a locking mechanism that may not be bypassed.

Another object of the present invention is to provide a locking mechanism that inserts the printed circuit board into a connector in the card cage when the locking mechanism is moved from an unlocked position to a locked position.

A further object of the present invention is to provide a locking mechanism that extracts the printed circuit board from a connector in the card cage when the locking mechanism is moved from a locked to a unlocked position.

An apparatus is described that includes a printed circuit board, a card cage, and a locking and latching assembly mounted on the printed circuit board. The locking and latching assembly is movable from an unlocked position to a locked position to lock the printed circuit board into the card cage. The locking and latching assembly is unmovable to return to the unlocked position without an aid of a separate unlocking mechanism.

Other objects, and advantages of the present invention will be apparent from the accompanying drawings and from the detailed description that follows below.

BRIEF DESCRIPTION OF THE DRAWINGS

The present invention is illustrated by way of example and not limitation in the figures of the accompanying drawings in which like references indicate similar elements and in which:

FIG. 1 illustrates an embodiment of the latching and locking assembly as used for locking a printed circuit board in a card cage.

FIG. 2a illustrates an embodiment of the latching and locking assembly with the extractor in a position approximately 90 degrees with respect to the face plate.

FIG. 2b illustrates an embodiment of the latching and locking assembly with the extractor in a position approximately 45 degrees with respect to the face plate.

FIG. 2c illustrates an embodiment of the latching and locking assembly with the latch partially engaged with an opening in the face plate.

FIG. 2d illustrates an embodiment of the latching and locking assembly in the locked position with the latch engaged with an opening in the face plate.

FIG. 3 is an exploded view of an embodiment of the latching and locking assembly of the present invention.

FIG. 4 illustrates a backside view of an embodiment of the latching and locking assembly.

FIG. 5a illustrates a printed circuit board with a locking and latching assembly in an unlocked position.

FIG. 5b illustrates a printed circuit board with a locking and latching assembly in a locked position.

FIG. 6 illustrates how the latch is disengaged from an opening in the face plate through the use of an unlocking mechanism.

DETAILED DESCRIPTION

FIG. 1 illustrates an embodiment of the latching and locking assembly 150 used for locking a printed circuit board 130 in a card cage 110. Card cage 110 houses a plurality of printed circuit boards. Card cage 110 is a rectangular prism shaped frame having a closed back and an open front. Card cage 110 comprises a top panel 111, a bottom panel 112, two side panels 113 and a back panel 114. Card cage 110 is adapted to mount a plurality of printed circuit boards 130 and 131. The top panel 111 of card cage 110 comprises a channel 116 that runs along the edge of the top panel facing the front of the card cage 110. Channel 116 comprises an inner wall that faces the front of card cage 110 and an outer wall that faces the back of card cage 110.

A plurality of rails 120 are provided to slidably receive the printed circuit board 130. The rails 120 are provided on at least one of the panels that define each printed circuit board mounting area. The back panel 114 of card cage 110 has electrical connectors 125 adapted to engage the electrical connectors 135 of the printed circuit boards 130. Interconnection of the printed circuit board 130 into a system is facilitated thereby.

Locking and latching assembly 150 is attached to printed circuit board 130. Locking and latching mechanism 150 is shown to be in an unlocked position. Printed circuit board 130 is allowed to slide freely in and out of card cage 110 along rails 120. When locking and latching mechanism 150 is moved from an unlocked position to a locked position, an extractor element in the locking and latching mechanism 150 catches the channel 116 on the top panel 111 of the card cage 110 to lock the printed circuit board in the card cage 110.

FIG. 2a illustrates a cross-section view of card cage 110 and side view of locking and latching mechanism 150. Locking and latching mechanism 150 comprises face plate 230. Face plate 230 is attached printed circuit board 130. A lever 210 is rotatably mounted on face plate 230 by pin 240. An extractor element 220 is also rotatably mounted on face plate 230 by pin 240. Extractor element 220 is attached to lever 210 by pin 241 such that extractor element 220 rotates with lever 210. Extractor element 220 has a tab portion 221 that resides inside a channel 225 in face plate 230 when extractor element 220 is in a position that is approximately 90 degrees with respect to face plate 230. Latch 215 is rotatably mounted on lever 210 by pin 241. Latch 215 comprises a back portion 216 and a hook portion 217. A spring element 245 is mounted on face plate 230 by pin 240. Spring element 245 is in contact with face plate 230 and lever 210 and operates to exert pressure on latch 215 such that latch 215 rotates counter-clockwise around pin 241 and back portion 216 of latch 215 pushes firmly against lever 210.

FIG. 2b illustrates an embodiment of the latching and locking assembly 150 with the extractor element 220 in a position that is approximately 45 degrees with respect to the face plate 230. As illustrated in FIG. 2b, extractor element 220 is attached to lever 210 such that the extractor element 220 rotates counter-clockwise around pin 240 with lever 210 when lever 210 is pushed downward to rotate counter-clockwise around pin 240. As extractor element 220 and lever 210 rotates counter-clockwise, tab portion 221 moves out of channel 225 and into channel 116. Tab portion 221 hooks against the outer wall 251 of channel 116 such that the counter-clockwise rotation of lever 210 and extractor element 220 around pin 240 pushes printed circuit board 130 further in the card cage 110 and pushes connectors 135 on the printed circuit board into connectors 125 in the card cage 110.

FIG. 2c illustrates an embodiment of the latching and locking assembly 150 with the extractor element 220 in a position which is approximately 20 degrees with the face plate 230. In this position, as lever 210 continues to rotate counter-clockwise around pin 240, the hook portion 217 of latch 215 pushes against the edge of opening 231 in face plate 230. As the force used to rotate lever 210 counter-clockwise around pin 240 exceeds the pressure of spring 245, latch 215 rotates clockwise around pin 241. The back portion 216 of latch 215 is pushed away from lever 210 as the hook portion 217 of latch 215 becomes partially engaged with opening 231 in the face plate. The back portion 216 of latch 215 is positioned between lever 210 and extractor element 220. Extractor element 220 supports the back portion 216 of latch 215 and prevents latch 215 from rotating counter-clockwise more than approximately 30 degrees regardless of how much pressure is exerted on lever 210 to rotate lever 210 counter-clockwise around pin 240. As tab portion 221 of extractor element 220 continues to rotate counter-clockwise around pin 240 with lever 210, connectors 135 of printed circuit board 130 are pushed farther into connectors 125 in card cage 110.

FIG. 2d illustrates an embodiment of the latching and locking assembly 150 with the extractor element 220 in a position that is approximately 0 degrees with respect to face plate 230. As illustrated in FIG. 2d, lever 210 is rotated such that the hook portion 217 of latch 215 is inside opening 231 of face plate 230. When hook portion 217 is inside opening 231, hook portion 217 no longer pushes against the edge of opening 231. This allows spring element 245 to push the back portion 216 of latch 215 firmly against lever 210. This causes latch 215 to rotate counter-clockwise around pin 241 and engage opening 231 such that hooked portion 217 is locked inside opening 231. Lever 210 and extractor element 220 are locked in this position, which causes tab portion 221 to be unmovable. As a result, tab portion 221 locks printed circuit board 130 inside card cage 110.

The most effective way for connecting connectors 135 of printed circuit board 130 with electrical connector 125 is to use tab portion 221 to exert a force for inserting printed circuit board 130 inside card cage 110. Tab portion 221 pushes against outer wall 221, which causes circuit board 130 to be pushed completely into card cage 110. Locking and latching assembly 150 automatically locks printed circuit board 130 into card cage 110 as tab portion 221 is rotated to a position where connectors 135 of printed circuit board 130 are in contact with electrical connector 125. Thus, the locking feature of locking and latching assembly 150 may not be bypassed when using tab portion 221 to insert connectors 135 into connectors 125.

FIG. 3 illustrates an exploded view of locking and latching assembly 150. Lever 210 has a front side 301 and a back side 302. The front side 301 of lever 210 has a flat surface. The front side 301 of lever 210 faces the front side of card cage 110 when lever 210 is in a locked position. The back side 302 of lever 210 has pin supporter 305 for holding pin 240. Pin 240 operates to rotatably mount lever 210, extractor element 220, and spring element 245 onto face plate 230. The back side 302 of lever 210 has pin supporter 306 for holding pin 241. Pin 241 operates to rotatably mount latch 215 onto lever 210 and to attach extractor element 220 to lever 210.

Extractor element 220 has a back portion 310 and a tab portion 221. Extractor element 220 has a first hole 311 and a second hole 312. The first hole 311 in extractor element 220 is used for threading pin 240 into extractor element 220. Pin 240 operates to rotatably couple extractor element 220 onto face plate 230. The second hole 312 in extractor element 220 is used for threading pin 241 into extractor element 220. Pin 241 is used for attaching extractor element 220 to lever 210. When extractor element 220 is attached to lever 210, the back portion 310 of extractor element 220 presses firmly against lever 210 such that pressure applied to the front side 301 of lever 210 causes extractor element 220 to rotate with lever 210 around pin 240. Extractor element 220 is made of a material that is strong enough to withstand pressure and successfully lock printed circuit board 130 in cage 110 by catching channel 116 on top panel 111. For one embodiment of the present invention, extractor element 220 is made of metal.

Spring element 245 comprises a first end 316, a second end 315, a base portion 317, and coils 318. Pin 240 is threaded through coils 318 to mount spring element 245 on face plate 230. Base portion 317 of spring element 245 is in contact with face plate 230 and pushes against face plate 230. First end 316 of spring element 245 is in contact with lever 210 and pushes against lever 210. Second end 315 of spring element 245 is in contact with latch 215 and applies a force on latch 215 such that latch 215 rotates counter-clockwise around pin 241, which causes the back portion 216 of latch 215 to be pushed firmly against the back side 302 of lever 210. In one embodiment of the present invention, spring element 245 is a tension spring. In another embodiment of the present invention, spring element 245 is made from music wire.

Latch 215 comprises a back portion 216 and a hook portion 217. Latch 215 has threaded holes 320. Pin 241 threads through holes 320 to rotatably mount latch 215 on to lever 210.

Face plate 230 comprises channel 225, pin supporters 325, and opening 231. Pin supporter 325 operates to hold pin 240. Pin 240 mounts lever 210, extractor element 220, and spring element 245 onto face plate 230. Channel 225 is a recess that houses tab portion 221 of extractor element 220 when extractor element is approximately 90 degrees with respect to face plate 230. When tab portion 221 is housed within channel 225, printed circuit board 130 is free to slide in and out of card cage 110. The hooked portion 217 of latch 215 enters into opening 231 when lever 210 is in the locked position. Hooked portion 217 engages opening 231 to lock lever 210 in the locked position.

Light panel 340 is mounted on face plate 230. Light panel 340 has windows 345 for displaying light emitting diodes (LEDs) from printed circuit board 130. Light pipes may be used for transmitting lights from the printed circuit board to windows 345 of light panel 340.

Ground plate 350 is attached to face plate 230. Ground plate 350 operates to block radiation from the printed circuit board 130 from radiating outwards towards face plate 230. Ground plate 350 also operates to provide structural strength for face plate 230 to prevent it from bowing. Ground plate 350 comprises a plurality of holes 351 for screws for attaching printed circuit board 130.

FIG. 4 illustrates the backside of a locking and latching assembly of one embodiment of the present invention. As illustrated in FIG. 4, the backside 302 of lever 210 has pin supporter 306 for holding pin 241 and pin supporter 305 for holding pin 240. Pin 241 threads through latch 215 and extractor 220. Pin 240 threads through extractor 220, face plate pin supporter 325, and the coils 318 of spring element 245. The backside 302 of lever 210 also comprises inlet 411. Inlet 411 operates to support the first end 316 of spring element 245.

Latch 215 comprises hook portion 217 and channel 410. Channel 410 operates to support the second end 315 of spring element 245. The second end 315 of spring element 245 applies a force on latch 215 on channel 410.

FIG. 5a shows a printed circuit board 130 with a locking and latching assembly 150 in an unlocked position. FIG. 5b shows a printed circuit board 130 with a locking and latching assembly 150 in a locked position. To lock the locking and latching assembly 150, lever 210 must be depressed so that the lever 210 rotates counter-clockwise around pin 240. Tab portion 221 of extractor element 220 rotates out of canal 225 and into channel 116. As extractor element 220 rotates counter-clockwise with lever 210, tab portion 221 pushes against the outer wall 251 of channel 116 and pushes printed circuit board 130 farther into card cage 110. This results in the insertion of connectors 135 of printed circuit board 130 into connector 125 of the card cage 110.

As illustrated in FIG. 5b, when locking and latching assembly 150 is in a locked position, spring element 245 operates to rotate latch 215 counter-clockwise along pin 241 until back portion 216 presses firmly against lever 210 and latch 215 is engaged with opening 231. When latch 215 is engaged with opening 231, lever 210 and extractor element 220 may not rotate in any direction. This causes tab portion 221 to be fixed in channel 116, locking printed circuit board 130 in card cage 110.

FIG. 6 illustrates how the latch 215 is disengaged from an opening 231 in the face plate 230 through the use of an unlocking mechanism 610. Lever 210 comprises an opening 620 which extends from the front side 301 of lever 210 to the back side 302 of lever 210. The opening 620 in lever 210 is adjacent to the back portion 216 of latch 215. Unlocking mechanism 610 comprises a pointed edge 615 that may be used to slide through opening 620 on lever 210. The pointed edge 615 of unlocking mechanism 610 may be used to exert force on the back portion 216 of latch 215 that exceeds the force of spring element 245. When this force is exerted on the back portion 216 of latch 215, latch 215 will rotate clockwise around pin 241 and disengage hook portion 217 of latch 215 from opening 231 in face plate 230. When hook portion 217 is disengaged from opening 231, lever 210 and extractor element 220 are free to rotate clockwise around pin 240 to an unlocked position.

To extract printed circuit board 130 out of card cage 110, one may pull lever 210 upwards. By rotating lever 210 clockwise around pin 240, tab portion 221 of extractor element 220 also rotates clockwise around pin 240. Tab portion 221 pushes against the inner wall 252 of channel 116 and causes connectors 135 of printed circuit board 130 to be extracted from connector 125 of card cage 110.

If unlocking mechanism 610 was used to unlock locking and latching assembly 150, but printed circuit board 130 was still in card cage 110 such that connectors 135 of printed circuit board 130 were still connected with electrical connector 125, one would be able to determine the locking status of latching and locking assembly by observing the position of lever 210. When the latching and locking assembly 150 is unlocked, spring element 245 exerts pressure on lever 210 and rotates lever 210 clockwise around pin 240 such that lever 210 is at approximately 6 degrees with respect to face plate 230. This is illustrated in FIG. 2c and with locking and latching assembly 151 in FIG. 1. When latching and locking assembly 150 is in a locked position, lever 210 is at approximately 0 degrees with face plate 230. This is illustrated in FIG. 2d and with locking and latching assembly 150 in FIG. 1. Thus, the position of lever 210 gives an indication of the locking status of latching and locking assembly 150.

In the foregoing description, the invention is described with reference to specific exemplary embodiments thereof. It will, however, be evident that various modifications and changes may be made thereto without departing from the broader spirit and scope of the invention as set forth in the appended claims. The specifications and drawings are, accordingly, to be regarded in an illustrative rather than a restrictive sense.

What is claimed is:

1. An apparatus, comprising:
   (A) a printed circuit board;
   (B) a card cage; and
   (C) a locking and latching assembly mounted on the printed circuit board, the locking and latching assembly including a lever and a latch, wherein the locking and latching assembly is movable from an unlocked position to a locked position to lock the printed circuit board into the card cage, and wherein the latch is held in an engaged position such that the locking and latching assembly is unmovable to return to the unlocked position without applying a separate mechanical unlocking mechanism to the latch.

2. The apparatus of claim 1, wherein said locking and latching assembly is mounted to said printed circuit board by a plurality of screws.

3. The apparatus of claim 1, wherein said locking and latching assembly pushes said printed circuit board into a connector in said card cage when said locking and latching assembly is moved from said unlocked position to said locked position.

4. The apparatus of claim 1, wherein said locking and latching assembly pulls said printed circuit board out of a connector in said card cage when said locking and latching assembly is moved from said locked position to said unlocked position.

5. The apparatus of claim 1, wherein said unlocking mechanism is an object with a pointed edge.

6. A locking mechanism comprising:
   a face plate attached to a printed circuit board, said face plate having a first opening;
   a lever rotatably mounted on said face plate, said lever having a second opening;
   an extractor rotatably mounted on said face plate and attached to said lever such that said extractor rotates with said lever; and
   a latch rotatably mounted on said lever, wherein when said lever is moved to a locked position said extractor locks said printed circuit board into a card cage and said latch is engaged with said first opening locking said lever in said locked position, wherein said lever is released to an unlocked position by inserting a separate unlocking mechanism through said second opening such that said separate unlocking mechanism rotates said latch to disengage said latch from said first opening.

7. The mechanism of claim 6, wherein said face plate further comprises a recess, wherein said recess houses said extractor when said lever is in said unlocked position.

8. The mechanism of claim 6, wherein said face plate further comprises a first pin supporter for holding a first pin and said lever and said extractor is rotatably mounted on said face plate through said first pin on said first pin supporter.

9. The mechanism of claim 8, wherein said lever further comprises a second pin supporter for holding a second pin and said latch is rotatably mounted on said lever through said second pin on said second pin supporter.

10. The mechanism of claim 9, wherein said extractor is attached to said second pin.

11. The mechanism of claim 6, further comprising a spring element in contact with said face plate, said lever, and said latch, said spring element applying a force on said latch which causes said latch to be engaged with said first opening.

12. The mechanism of claim 11, wherein said spring element is a tension spring.

13. The mechanism of claim 6, wherein said unlocking mechanism is an object with a pointed edge.

14. An apparatus comprising:
   a printed circuit board;
   a card cage for housing said printed circuit board, said card cage having a connector for electrically connecting circuitry on said printed circuit board with other circuitry housed in said card cage; and
   a mechanism for locking said printed circuit board into said card cage, said mechanism having
      a) a face plate attached to said printed circuit board, said face plate having a first opening;
      b) a lever rotatably mounted on said face plate, said lever having a second opening;
      c) an extractor rotatably mounted on said face plate and attached to said lever such that said extractor rotates with said lever; and
      d) a latch rotatably mounted on said lever, wherein when said lever is moved to a locked position said extractor locks said printed circuit board into said card cage and said latch is engaged with said first opening locking said lever in said locked position, wherein said lever is released to an unlocked position by inserting a separate unlocking mechanism through said second opening to move said latch to disengage said latch from said first opening.

15. The apparatus of claim 14, wherein said face plate further comprises a recess, wherein said recess houses said extractor when said lever is in said unlocked position.

16. The apparatus of claim 14, wherein said face plate further comprises a first pin supporter for holding a first pin and said lever and said extractor is rotatably mounted on said face plate through said first pin on said pin supporter.

17. The apparatus of claim 16, wherein said lever further comprises a second pin supporter for holding a second pin and said latch is rotatably mounted on said lever through said second pin on said pin supporter.

18. The apparatus of claim 14, further comprising a spring element in contact with said face plate, said lever, and said latch, said spring element applying a force on said latch which causes said latch to be engaged with said first opening.

19. The apparatus of claim 18, wherein said spring element is a tension spring.

20. The apparatus of claim 14, wherein said unlocking mechanism is an object with a pointed edge.

* * * * *

UNITED STATES PATENT AND TRADEMARK OFFICE
CERTIFICATE OF CORRECTION

PATENT NO. : 6,185,106 B1
DATED : February 6, 2001
INVENTOR(S) : Robert S. Mueller Page 1 of 1

It is certified that error appears in the above-identified patent and that said Letters Patent is hereby corrected as shown below:

On the title page at (22) please delete "Dec. 21, 1995" and insert --Dec. 20, 1995--

Signed and Sealed this

Fifth Day of June, 2001

*Attest:*

*Attesting Officer*

NICHOLAS P. GODICI
*Acting Director of the United States Patent and Trademark Office*

UNITED STATES PATENT AND TRADEMARK OFFICE
CERTIFICATE OF CORRECTION

PATENT NO.     : 6,185,106 B1
DATED          : February 6, 2001
INVENTOR(S)    : Robert S. Mueller It is certified that error appears in the above-identified patent and that said Letters Patent is hereby corrected as shown below:

Column 1,
Line 65, delete one of the repeated "and"

Column 4,
Line 18, delete "221" and insert -- 251 --

Signed and Sealed this

Second Day of October, 2001

Attest:

NICHOLAS P. GODICI
Attesting Officer    Acting Director of the United States Patent and Trademark Office